(12) United States Patent
Shen

(10) Patent No.: US 7,672,130 B2
(45) Date of Patent: Mar. 2, 2010

(54) HEAT DISSIPATING DEVICE

(76) Inventor: Yu-Nung Shen, No. 60, Lane 328 Li-Shan Street, Nei-Hu District, Taipei City (TW)

( * ) Notice: Subject to any disclaimer, the term of this patent is extended or adjusted under 35 U.S.C. 154(b) by 0 days.

(21) Appl. No.: 12/229,971

(22) Filed: Aug. 27, 2008

(65) Prior Publication Data

US 2009/0059527 A1 Mar. 5, 2009

(30) Foreign Application Priority Data

Aug. 31, 2007 (TW) .............................. 96214647 U

(51) Int. Cl.
*H05K 7/20* (2006.01)

(52) U.S. Cl. .................. 361/699; 361/700; 165/104.21; 165/148; 165/165; 422/129

(58) Field of Classification Search ................. 361/695, 361/699, 700, 704
See application file for complete search history.

(56) References Cited

U.S. PATENT DOCUMENTS 6,910,528 B2 * 6/2005 Abiko et al. ................ 165/166
7,017,657 B2 * 3/2006 Sugito et al. ........... 165/104.21
7,272,005 B2 * 9/2007 Campbell et al. ........... 361/699
2006/0096746 A1 * 5/2006 Arpin et al. ................. 165/166
2006/0165570 A1 * 7/2006 Knopf et al. ................ 422/224

* cited by examiner

*Primary Examiner*—Jayprakash N Gandhi
*Assistant Examiner*—Courtney Smith
(74) *Attorney, Agent, or Firm*—Townsend and Townsend and Crew, LLP

(57) ABSTRACT

A heat dissipating device includes a sealed container having hollow floors and floor-spacing assemblies. Each floor-spacing assembly includes hollow spacing walls. Each hollow spacing wall extends from a respective hollow floor and is spaced apart from an adjacent one of the hollow spacing walls of an adjacent one of the floor-spacing assemblies by an air gap. Each two adjacent ones of the hollow floors are interconnected through the hollow spacing walls disposed therebetween. The sealed container defines a liquid reservoir, a condensate reservoir, and a plurality of fluid passages extending through the hollow spacing walls and the hollow floors that are disposed between the liquid reservoir and the condensate reservoir.

9 Claims, 6 Drawing Sheets

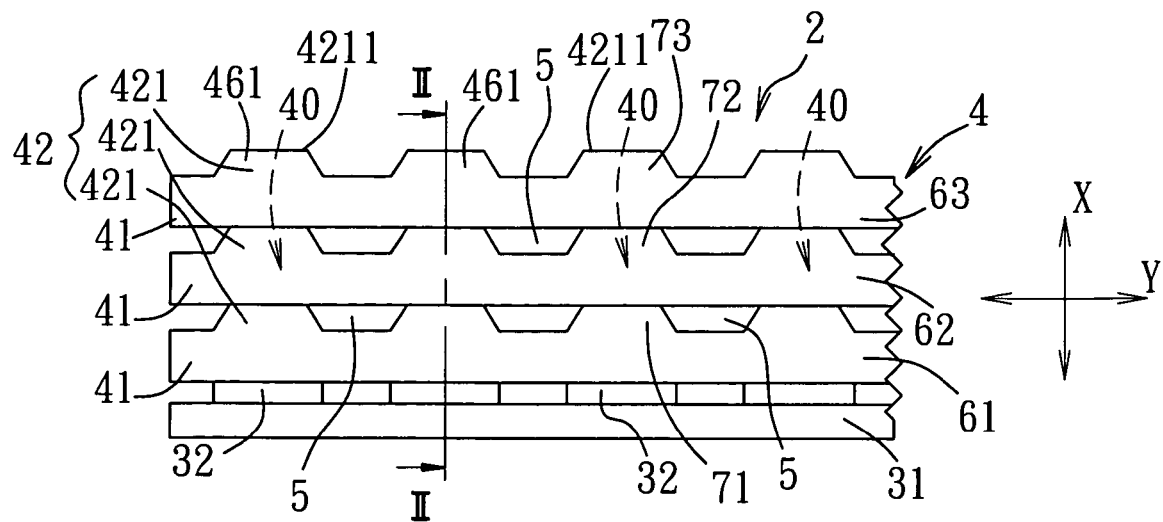
F I G. 1
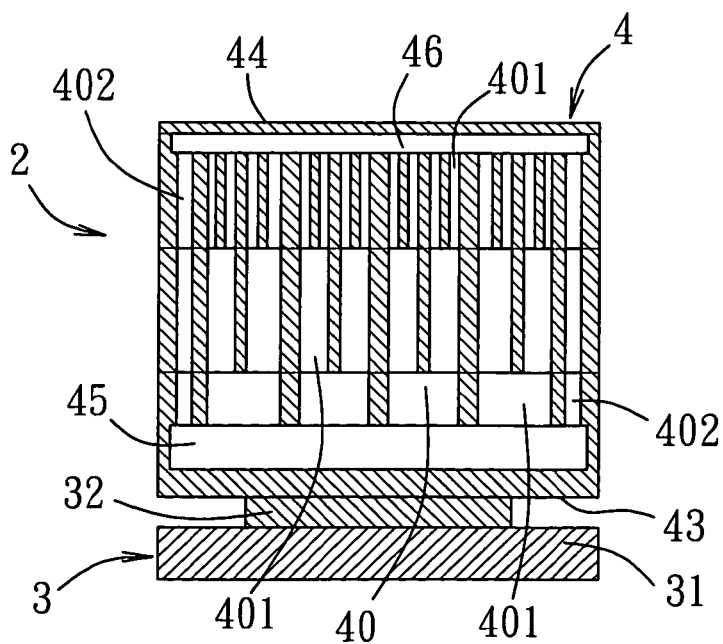
F I G. 2

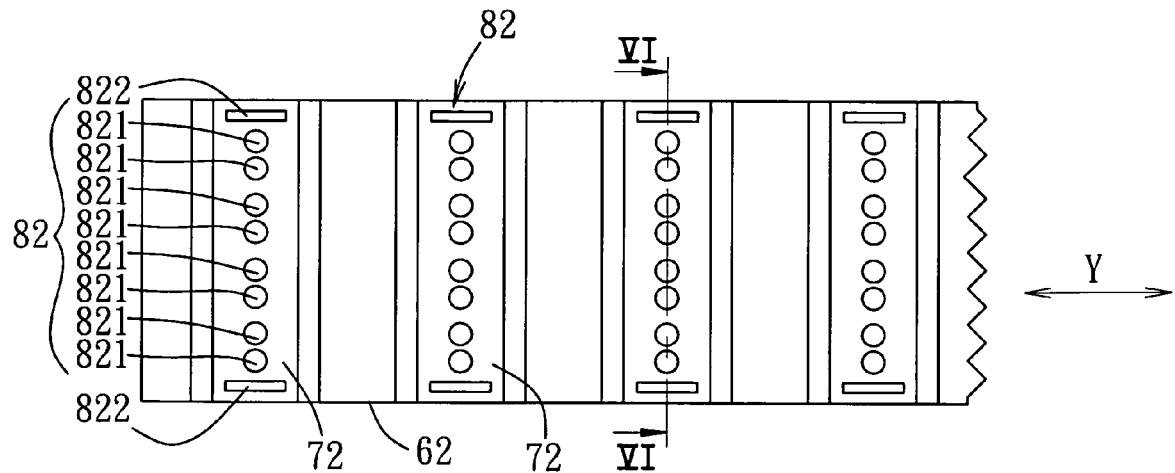
F I G. 5
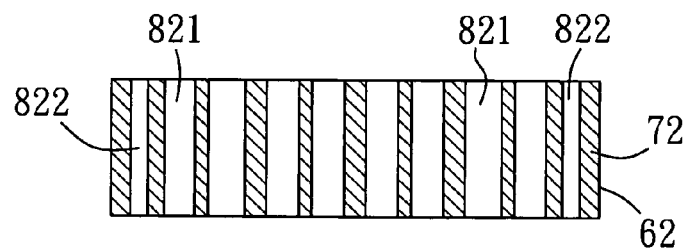
F I G. 6

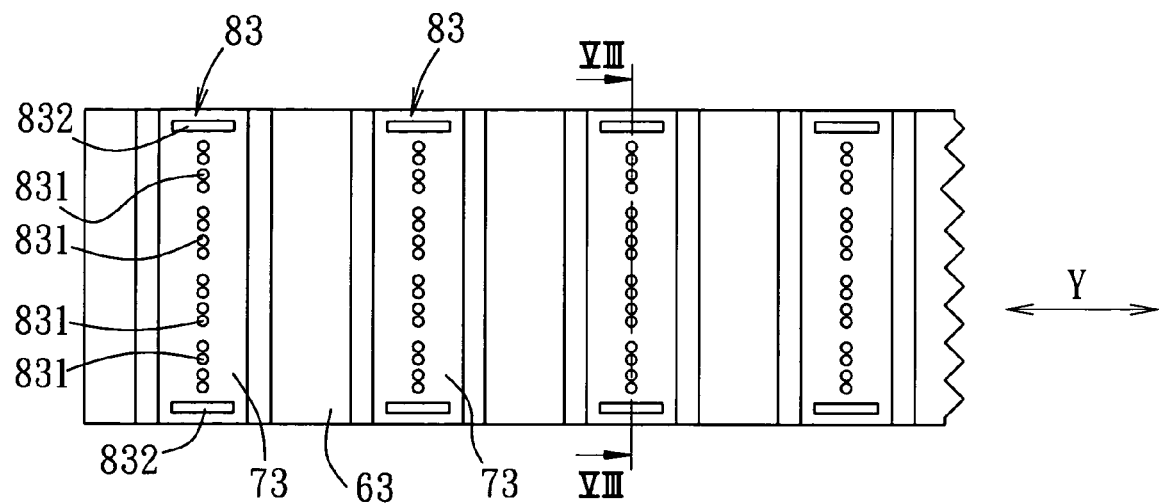
F I G. 7
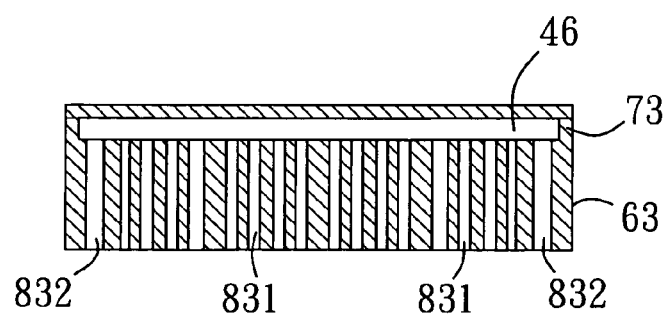
F I G. 8

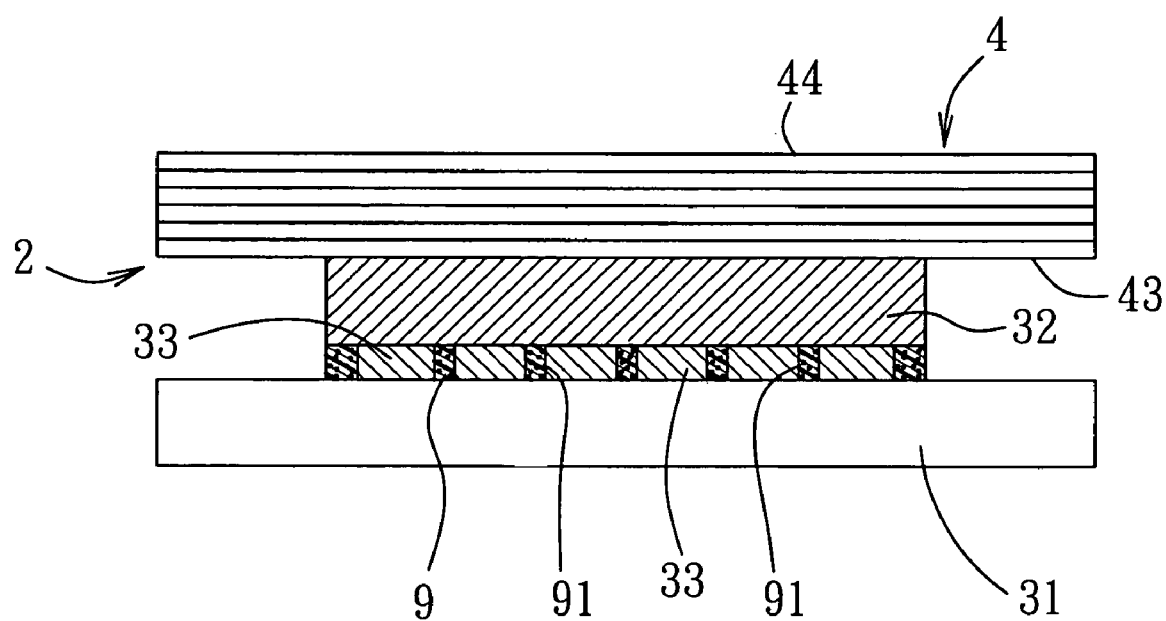
F I G. 9

HEAT DISSIPATING DEVICE

CROSS-REFERENCE TO RELATED APPLICATION

This application claims priority to Taiwanese Application No. 096214647, filed Aug. 31, 2007, the disclosure of which is herein incorporated by reference.

BACKGROUND OF THE INVENTION

1. Field of the Invention

The invention relates to a heat dissipating device, more particularly to a heat dissipating device including a sealed container of a multi-level structure that is formed with a plurality of fluid passages and a plurality of air gaps among exteriors of walls confining the fluid passages.

2. Description of the Related Art

A conventional heat dissipating device, such as a heat pipe, normally includes a sealed container with a working fluid and a wick structure received therein. The heat pipe is attached to a heat source, such as an integrated circuit component, for absorbing heat generated by the heat source and transferring the heat to the outside environment. In use, an amount of the working fluid is vaporized at a hot end of the sealed container that is attached to the heat source, and carries the heat from the heat source to a cold end of the sealed container. The vapor of the working fluid is subsequently condensed at the cold end to form a condensate which is returned to the hot end through the wick structure. However, the sealed container of the conventional heat dissipating device normally has only one fluid passage for passage of the vapor from the hot end to the cold end of the sealed container and for passage of the condensate from the cold end to the hot end of the sealed container. As a consequence, the cooling area provided by the sealed container for cooling the vapor generated in the sealed container is relatively limited.

SUMMARY OF THE INVENTION

The object of the present invention is to provide a heat dissipating device with a larger cooling area that can improve the heat dissipating efficiency as compared to the prior art.

According to the present invention, there is provided a heat dissipating device adapted to be attached to an integrated circuit unit for dissipating heat generated by the integrated circuit unit. The heat dissipating device comprises a sealed container of a multi-level structure that includes a plurality of hollow floors and a plurality of floor-spacing assemblies. The hollow floors are disposed one above the other and are aligned with each other along a vertical direction. The floor-spacing assemblies are spaced apart from each other and are aligned with each other along a horizontal direction. Each of the floor-spacing assemblies includes a plurality of hollow spacing walls that are disposed one above the other and that are aligned with each other in the vertical direction. Each of the hollow spacing walls of each of the floor-spacing assemblies extends upwardly from a respective one of the hollow floors and is spaced apart from an adjacent one of the hollow spacing walls of an adjacent one of the floor-spacing assemblies in the horizontal direction by an air gap that is adapted for passage of cooling air therethrough. Each two adjacent ones of the hollow floors are interconnected through the hollow spacing walls of the floor-spacing assemblies disposed therebetween. The sealed container has a hot end that is adapted to be attached to the integrated circuit unit, and a cold end that is opposite to the hot end in the vertical direction. The sealed container defines a liquid reservoir that is disposed adjacent to the hot end and that is adapted to receive a working fluid therein, a condensate reservoir that is disposed adjacent to the cold end and that is adapted to collect a condensate condensed from a vapor of the working fluid vaporized in the liquid reservoir by absorbing heat generated by the integrated circuit unit, and a plurality of fluid passages extending between and in fluid communication with the liquid reservoir and the condensate reservoir. Each of the fluid passages extends through the hollow spacing walls of a respective one of the floor-spacing assemblies that are disposed between the liquid reservoir and the condensate reservoir and through the hollow floors that are disposed between the liquid reservoir and the condensate reservoir.

BRIEF DESCRIPTION OF THE DRAWINGS

Other features and advantages of the present invention will become apparent in the following detailed description of the preferred embodiment with reference to the accompanying drawings, of which:

FIG. 1 is a fragmentary schematic view of the preferred embodiment of a heat dissipating device according to this invention;

FIG. 2 is a sectional view taken along line II-II in FIG. 1;

FIG. 5 is a schematic top view of a second level of the multi-level structure of the sealed container of the preferred embodiment;

FIG. 6 is a sectional view taken along line VI-VI in FIG. 5;

FIG. 7 is a schematic top view of a third level of the multi-level structure of the sealed container of the preferred embodiment;

FIG. 8 is a sectional view taken along line VIII-VIII in FIG. 7;

FIG. 9 is a partly sectional view of an electronic module including the preferred embodiment attached to an integrated circuit unit.

DETAILED DESCRIPTION OF THE PREFERRED EMBODIMENT

Figure 3:
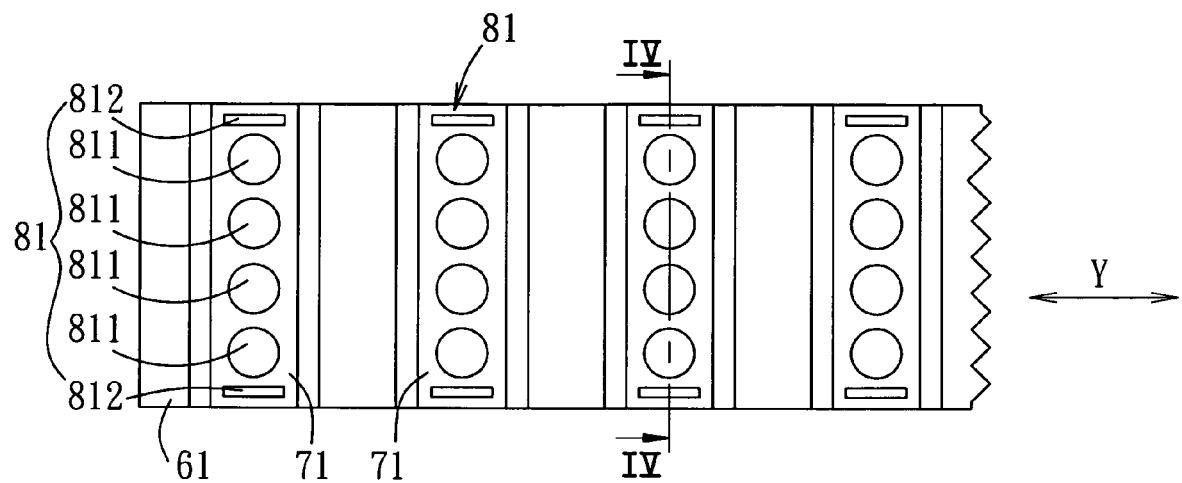
FIG. 3 is a schematic top view of a first level of a multi-level structure of a sealed container of the preferred embodiment.

Referring to FIGS. 1 and 2, the preferred embodiment of a heat dissipating device 2 according to the present invention is shown to be attached to an integrated circuit unit 3 for dissipating heat generated by the integrated circuit unit 3. The integrated circuit unit 3 includes a circuit board 31 and a plurality of integrated circuit components 32 mounted on the circuit board 31. The heat dissipating device 2 includes a sealed container 4 of a multi-level structure that includes a plurality of hollow floors 41 and a plurality of floor-spacing assemblies 42. The hollow floors 41 are disposed one above the other and are aligned with each other along a vertical direction (X). The floor-spacing assemblies 42 are spaced apart from each other and are aligned with each other along a horizontal direction (Y). Each of the floor-spacing assemblies 42 includes a plurality of hollow spacing walls 421 that are disposed one above the other and that are aligned with each other in the vertical direction (X). Each of the hollow spacing walls 421 of each of the floor-spacing assemblies 42 extends upwardly from a respective one of the hollow floors 41 and is spaced apart from an adjacent one of the hollow spacing walls 421 of an adjacent one of the floor-spacing assemblies 42 in the horizontal direction (Y) by an air gap 5 that is adapted for passage of cooling air therethrough. Each two adjacent ones of the hollow floors 41 are interconnected through the hollow spacing walls 421 of the floor-spacing assemblies 42 disposed therebetween. The sealed container 4 has a hot end 43 that is attached to the integrated circuit components 32 of the integrated circuit unit 3, and a cold end 44 that is opposite to the hot end 43 in the vertical direction (X). The sealed container 4 defines a liquid reservoir 45 that is disposed adjacent to the hot end 43 and that is adapted to receive a working fluid (not shown) therein, a condensate reservoir 46 that is disposed adjacent to the cold end 44 and that is adapted to collect a condensate condensed from a vapor of the working fluid vaporized in the liquid reservoir 45 by absorbing heat generated by the integrated circuit unit 3, and a plurality of fluid passages 40 extending between and in fluid communication with the liquid reservoir 45 and the condensate reservoir 46. Each of the fluid passages 40 extends through the hollow spacing walls 421 of a respective one of the floor-spacing assemblies 42 that are disposed between the liquid reservoir 45 and the condensate reservoir 46 and through the hollow floors 41 that are disposed between the liquid reservoir 45 and the condensate reservoir 46.

In this embodiment, the lowermost one of the hollow floors 41 defines the liquid reservoir 45, and has a bottom end defining the hot end 43 of the sealed container 4.

The condensate reservoir 46 has a plurality of sub-reservoirs 461 that are separated from each other. A topmost one of the hollow spacing walls 421 of each of the floor-spacing assemblies 42 has a top end 4211 and defines a respective one of the sub-reservoirs 461. The top ends 4211 of the topmost ones of the hollow spacing walls 421 of the floor-spacing assemblies 42 cooperatively define the cold end 44 of the sealed container 4.

Each of the fluid passages 40 is divided into two parallel condensate paths 402 that are in fluid communication with the liquid reservoir 45 and the condensate reservoir 46 for passage of the condensate from the condensate reservoir 46 to the liquid reservoir 45, and a plurality of vapor paths 401 that are parallel to and that are disposed between the condensate paths 402 and that are in fluid communication with the liquid reservoir 45 and the condensate reservoir 46 for passage of the vapor flowing from the liquid reservoir 45 to the condensate reservoir 46.

In this embodiment, the hollow floors 41 include first, second and third hollow floors 61, 62, 63. The hollow spacing walls 421 of each of the floor-spacing assemblies 42 include first, second and third hollow spacing walls 71, 72, 73. The third hollow floor 63 is disposed above the first and second hollow floors 61, 62. The second hollow floor 62 is disposed between the first and third hollow floors 61, 63. The first hollow floor 61 defines the liquid reservoir 45. The first hollow spacing wall 71 of each of the floor-spacing assemblies 42 interconnects the first and second hollow floors 61, 62. The second hollow spacing wall 72 of each of the floor-spacing assemblies 42 interconnects the second and third hollow floors 62, 63. The third hollow spacing walls 73 of the floor-spacing assemblies 42 cooperatively define the condensate reservoir 46. The first hollow floor 61 cooperates with the first hollow spacing walls 71 of the floor-spacing assemblies 42 to define a first level of the multi-level structure of the sealed container 4 (see FIGS. 3 and 4). The second hollow floor 62 cooperates with the second hollow spacing walls 72 of the floor-spacing assemblies 42 to define a second level of the multi-level structure of the sealed container 4 (see FIGS. 5 and 6). The third hollow floor 63 cooperates with the third hollow spacing walls 73 of the floor-spacing assemblies 42 to define a third level of the multi-level structure of the sealed container 4 (see FIGS. 7 and 8). The first hollow spacing walls 71 of the floor-spacing assemblies 42 are respectively formed with lower hole units 81 (see FIGS. 3 and 4) that are aligned with each other in the horizontal direction (Y). The second hollow spacing walls 72 of the floor-spacing assemblies 42 together with the second hollow floor 62 are respectively formed with middle hole units 82 (see FIGS. 5 and 6) that are aligned with each other in the horizontal direction (Y). The third hollow floor 63 is formed with upper hole units 83 (see FIGS. 7 and 8) that are aligned with each other in the horizontal direction (Y). Each of the upper hole units 83 is aligned with a respective one of the middle hole units 82 and a respective one of the lower hole units 81 in the vertical direction (X) and cooperates with the respective one of the middle hole units 82 and the respective one of the lower hole units 81 to define a respective one of the fluid passages 40.

Figure 4:
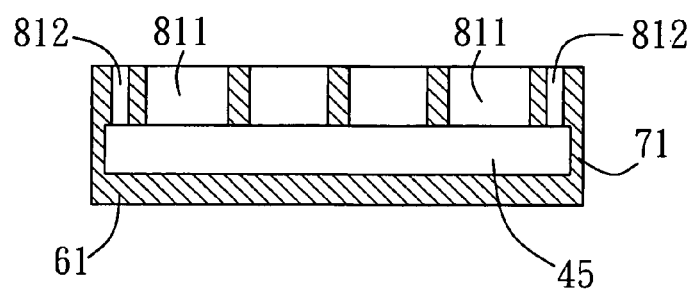
FIG. 4 is a sectional view taken along line IV-IV in FIG. 3.

In this embodiment, each of the lower hole units 81 has a plurality of lower vapor through-holes 811 that are spaced apart from each other (see FIGS. 3 and 4). Each of the middle hole units 82 has a plurality of middle vapor through-holes 821 that are spaced apart from each other (see FIGS. 5 and 6). Each of the upper hole units 83 has a plurality of upper vapor through-holes 831 that are spaced apart from each other (see FIGS. 7 and 8). Each of the lower vapor through-holes 811 of each of the lower hole units 81 is aligned with an adjacent pair of the middle vapor through-holes 821 of the respective one of the middle hole units 82 in the vertical direction (X) and is in fluid communication with the adjacent pair of the middle vapor through-holes 821 of the respective one of the middle hole units 82. Each of the middle vapor through-holes 821 of each of the middle hole units 82 is aligned with an adjacent pair of the upper vapor through-holes 831 of the respective one of the upper hole units 83 in the vertical direction (X) and is in fluid communication with the adjacent pair of the upper vapor through-holes 831 of the respective one of the upper hole units 83. Each of the lower vapor through-holes 811 of each of the lower hole units 81 cooperates with the vertically aligned pair of the middle vapor through-holes 821 of the respective one of the middle hole units 82 and the two vertically aligned pairs of the upper vapor through-holes 831 of the respective one of the upper hole units 83 to define a respective one of the vapor paths 401 of a respective one of the fluid passages 40.

Each of the upper hole units 83 further has a pair of upper condensate through-holes 832. Each of the middle hole units 82 further has a pair of middle condensate through-holes 822 aligned with the upper condensate through-holes 832 of the respective one of the upper hole units 83 in the vertical direction (X), respectively. Each of the lower hole units 81 further has a pair of lower condensate through-holes 812 aligned with the middle condensate through-holes 822 of the respective one of the middle hole units 82 in the vertical direction (X), respectively. Each of the upper condensate through-holes 832 of each of the upper hole units 83 cooperates with the vertically aligned one of the middle condensate through-holes 822 of the respective one of the middle hole units 82 and the vertically aligned one of the lower condensate through-holes 812 of the respective one of the lower hole units 81 to define a respective one of the condensate paths 402 of a respective one of the fluid passages 40.

In use, an amount of the working fluid in the liquid reservoir 45 is vaporized by absorbing heat generated by the integrated circuit components 32 to form vapor that rises through the vapor paths 401 and into the condensate reservoir 46 so as to be condensed in the condensate reservoir 46. The condensate collected in the condensate reservoir 46 is subsequently returned back to the liquid reservoir 45 through the condensate paths 402. As such, the working fluid in the liquid reservoir 45 undergoes a cyclic process of vaporization and condensation so as to dissipate the heat generated by the integrated circuit components 32 to the outside environment. It is noted that the condensate accumulated in the condensate reservoir 46 is guided to the upper condensate through-holes 832 through a guiding means (not shown), and that the condensate flowing from the condensate reservoir 46 to the liquid reservoir 45 through the condensate paths 402 is driven by a capillary action so that when the condensate is guided by the guiding means to the condensate paths 402, it can be pumped into the liquid reservoir 45 immediately, thereby permitting the vapor to flow from the liquid reservoir 45 to the condensate reservoir 46 through the vapor paths 401 only.

FIG. 9 illustrates an electronic module including an integrated circuit unit and the heat dissipating device 2 of the preferred embodiment. The integrated circuit unit includes a circuit board 31, at least one integrated circuit component 32, an insulator material 9 sandwiched between the circuit board 31 and the integrated circuit component 32 and formed with a plurality of solder holes 91, and a plurality of solder bodies 33 filling the solder holes 91, respectively, and coupled to the circuit board 31 and the integrated circuit component 32. The insulator material 9 contains a resin matrix and metal oxide particles dispersed in the resin matrix for enhancing heat conduction from the integrated circuit component 32 to conductive traces (not shown) of the circuit board 31 through the insulator material 9, thereby allowing a portion of the heat generated by the integrated circuit component 32 to be dissipated to the outside environment through the conductive traces of the circuit board 31.

Figure 10:
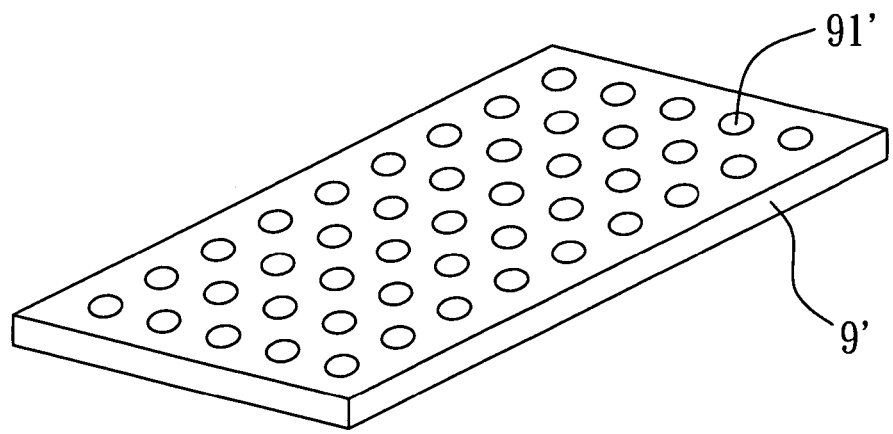
FIGS. 10 and 11 illustrate consecutive steps of a method for forming the electronic module of FIG. 9.
Figure 11:
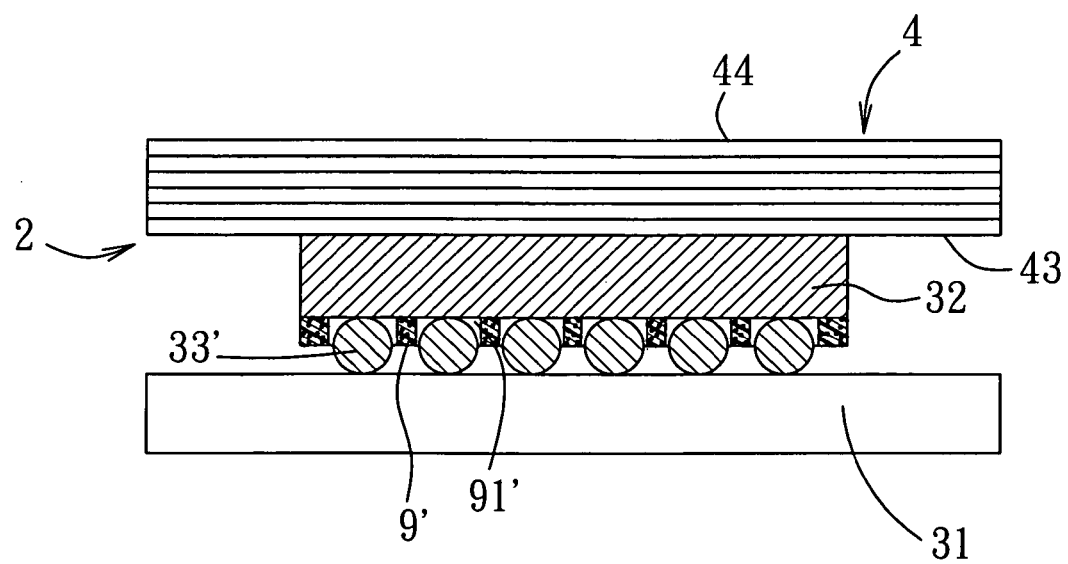

FIGS. 10 and 11 illustrate consecutive steps of a method for forming the electronic module. The method includes preparing an insulator sheet 9' formed with a plurality of holes 91' (see FIG. 10), filling the holes 91' in the insulator sheet 9' with solder balls 33', respectively, disposing the insulator sheet 9' between the integrated circuit component 32 and the circuit board 31, and heating the insulator sheet 9' and the solder balls 33' under a working temperature sufficient to permit softening of the insulator sheet 9' and to permit the solder balls 33' to undergo a reflowing process so as to form the electronic module. The use of the insulator sheet 9' prevents short circuit among the solder bodies 33 thus formed during the reflowing process.

With the inclusion of the hollow floors 41, the hollow spacing walls 421 of the floor-spacing assemblies 42, and the air gaps 5 among exteriors of the walls confining the fluid passages 40 in the heat dissipating device of this invention, the heat dissipating efficiency can be considerably improved as compared to the prior art.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A heat dissipating device adapted to be attached to an integrated circuit unit for dissipating heat generated by the integrated circuit unit, said heat dissipating device comprising:

a sealed container of a multi-level structure that includes a plurality of hollow floors and a plurality of floor-spacing assemblies, said hollow floors being disposed one above the other and being aligned with each other along a vertical direction, said floor-spacing assemblies being spaced apart from each other and being aligned with each other along a horizontal direction, each of said floor-spacing assemblies including a plurality of hollow spacing walls that are disposed one above the other and that are aligned with each other in the vertical direction, each of said hollow spacing walls of each of said floor-spacing assemblies extending upwardly from a respective one of said hollow floors and being spaced apart from an adjacent one of said hollow spacing walls of an adjacent one of said floor-spacing assemblies in the horizontal direction by an air gap that is adapted for passage of cooling air therethrough, each two adjacent ones of said hollow floors being interconnected through said hollow spacing walls of said floor-spacing assemblies disposed therebetween;

wherein said sealed container has a hot end that is adapted to be attached to the integrated circuit unit, and a cold end that is opposite to said hot end in the vertical direction, said sealed container defining a liquid reservoir that is disposed adjacent to said hot end and that is adapted to receive a working fluid therein, a condensate reservoir that is disposed adjacent to said cold end and that is adapted to collect a condensate condensed from a vapor of the working fluid vaporized in said liquid reservoir by absorbing heat generated by the integrated circuit unit, and a plurality of fluid passages extending between and in fluid communication with said liquid reservoir and said condensate reservoir, each of said fluid passages extending through said hollow spacing walls of a respective one of said floor-spacing assemblies that are disposed between said liquid reservoir and said condensate reservoir and through said hollow floors that are disposed between said liquid reservoir and said condensate reservoir.

2. The heat dissipating device of claim 1, wherein a lowermost one of said hollow floors defines said liquid reservoir, and has a bottom end defining said hot end of said sealed container.

3. The heat dissipating device of claim 1, wherein said condensate reservoir has a plurality of sub-reservoirs that are separated from each other, a topmost one of said hollow spacing walls of each of said floor-spacing assemblies having a top end and defining a respective one of said sub-reservoirs, said top ends of said topmost ones of said hollow spacing walls of said floor-spacing assemblies cooperatively defining said cold end of said sealed container.

4. The heat dissipating device of claim 1, wherein each of said fluid passages is divided into two parallel condensate paths that are in fluid communication with said liquid reservoir and said condensate reservoir for passage of the condensate from said condensate reservoir to said liquid reservoir, and a plurality of vapor paths that are parallel to and that are disposed between said condensate paths and that are in fluid communication with said liquid reservoir and said condensate reservoir for passage of the vapor flowing from said liquid reservoir to said condensate reservoir.

5. The heat dissipating device of claim 4, wherein said hollow floors include first, second and third hollow floors, said hollow spacing walls of each of said floor-spacing assemblies including first, second and third hollow spacing walls, said third hollow floor being disposed above said first and second hollow floors, said second hollow floor being disposed between said first and third hollow floors, said first hollow floor defining said liquid reservoir, said first hollow spacing wall of each of said floor-spacing assemblies interconnecting said first and second hollow floors, said second hollow spacing wall of each of said floor-spacing assemblies interconnecting said second and third hollow floors, said third hollow spacing walls of said floor-spacing assemblies cooperatively defining said condensate reservoir, said first hollow spacing walls of said floor-spacing assemblies being respectively formed with lower hole units that are aligned with each other in the horizontal direction, said second hollow spacing walls of said floor-spacing assemblies together with said second hollow floor being respectively formed with middle hole units that are aligned with each other in the horizontal direction, said third hollow floor being formed with upper hole units that are aligned with each other in the horizontal direction, each of said upper hole units being aligned with a respective one of said middle hole units and a respective one of said lower hole units in the vertical direction and cooperating with the respective one of said middle hole units and the respective one of said lower hole units to define a respective one of said fluid passages.

6. The heat dissipating device of claim 5, wherein each of said lower hole units has a plurality of lower vapor through-holes that are spaced apart from each other, each of said middle hole units having a plurality of middle vapor through-holes that are spaced apart from each other, each of said upper hole units having a plurality of upper vapor through-holes that are spaced apart from each other, each of said lower vapor through-holes of each of said lower hole units being aligned with an adjacent pair of said middle vapor through-holes of the respective one of said middle hole units in the vertical direction and being in fluid communication with said adjacent pair of said middle vapor through-holes of the respective one of said middle hole units, each of said middle vapor through-holes of each of said middle hole units being aligned with an adjacent pair of said upper vapor through-holes of the respective one of said upper hole units in the vertical direction and being in fluid communication with said adjacent pair of said upper vapor through-holes of the respective one of said upper hole units, each of said lower vapor through-holes of each of said lower hole units cooperating with the vertically aligned pair of said middle vapor through-holes of the respective one of said middle hole units and the two vertically aligned pairs of said upper vapor through-holes of the respective one of said upper hole units to define a respective one of said vapor paths of a respective one of said fluid passages.

7. The heat dissipating device of claim 6, wherein each of said upper hole units further has a pair of upper condensate through-holes, each of said middle hole units further having a pair of middle condensate through-holes aligned with said upper condensate through-holes of the respective one of said upper hole units in the vertical direction, respectively, each of said lower hole units further having a pair of lower condensate through-holes aligned with said middle condensate through-holes of the respective one of said middle hole units in the vertical direction, respectively, each of said upper condensate through-holes of each of said upper hole units cooperating with the vertically aligned one of said middle condensate through-holes of the respective one of said middle hole units and the vertically aligned one of said lower condensate through-holes of the respective one of said lower hole units to define a respective one of said condensate paths of a respective one of said fluid passages.

8. An electronic module comprising:
an integrated circuit unit including a circuit board, an integrated circuit component, an insulator material sandwiched between said circuit board and said integrated circuit component and formed with a plurality of solder holes, and a plurality of solder bodies filling said solder holes, respectively, and coupled to said circuit board and said integrated circuit component; and
a heat dissipating device including
a sealed container of a multi-level structure that includes a plurality of hollow floors and a plurality of floor-spacing assemblies, said hollow floors being disposed one above the other and being aligned with each other along a vertical direction, said floor-spacing assemblies being spaced apart from each other and being aligned with each other along a horizontal direction, each of said floor-spacing assemblies including a plurality of hollow spacing walls that are disposed one above the other and that are aligned with each other in the vertical direction, each of said hollow spacing walls of each of said floor-spacing assemblies extending upwardly from a respective one of said hollow floors and being spaced apart from an adjacent one of said hollow spacing walls of an adjacent one of said floor-spacing assemblies in the horizontal direction by an air gap that is adapted for passage of cooling air therethrough, each two adjacent ones of said hollow floors being interconnected through said hollow spacing walls of said floor-spacing assemblies disposed therebetween;
wherein said sealed container has a hot end that is attached to said integrated circuit component, and a cold end that is opposite to said hot end in the vertical direction, said sealed container defining a liquid reservoir that is disposed adjacent to said hot end and that is adapted to receive a working fluid therein, a condensate reservoir that is disposed adjacent to said cold end and that is adapted to collect a condensate condensed from a vapor of the working fluid vaporized in said liquid reservoir by absorbing heat generated by said integrated circuit component, and a plurality of fluid passages extending between and in fluid communication with said liquid reservoir and said condensate reservoir, each of said fluid passages extending through said hollow spacing walls of a respective one of said floor-spacing assemblies that are disposed between said liquid reservoir and said condensate reservoir and through said hollow floors that are disposed between said liquid reservoir and said condensate reservoir.

9. The electronic module of claim 8, wherein said insulator material contains a gel matrix and metal oxide particles dispersed in said gel matrix.

* * * * *